United States Patent
Shinde et al.

(10) Patent No.: US 9,029,071 B2
(45) Date of Patent: May 12, 2015

(54) SILICON OXYNITRIDE FILM FORMATION METHOD AND SUBSTRATE EQUIPPED WITH SILICON OXYNITRIDE FILM FORMED THEREBY

(75) Inventors: Ninad Shinde, Shizuoka (JP); Tatsuro Nagahara, Shizuoka (JP); Yusuke Takano, Tokyo (JP)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/704,532

(22) PCT Filed: Aug. 10, 2011

(86) PCT No.: PCT/IB2011/001839
§ 371 (c)(1),
(2), (4) Date: Mar. 1, 2013

(87) PCT Pub. No.: WO2011/158119
PCT Pub. Date: Dec. 22, 2011

(65) Prior Publication Data
US 2013/0164690 A1 Jun. 27, 2013

(30) Foreign Application Priority Data

Jun. 17, 2010 (JP) .................................. 2010-138102

(51) Int. Cl.
*G03F 7/20* (2006.01)
*H01L 21/02* (2006.01)
*B05D 3/06* (2006.01)
*C23C 18/12* (2006.01)
*C23C 18/14* (2006.01)

(52) U.S. Cl.
CPC ............ *H01L 21/0214* (2013.01); *B05D 3/065* (2013.01); *C23C 18/1216* (2013.01); *C23C 18/122* (2013.01); *C23C 18/14* (2013.01); *H01L 21/02222* (2013.01); *H01L 21/02348* (2013.01); *H01L 21/02282* (2013.01)

(58) Field of Classification Search
CPC .................. H01L 21/02222; H01L 21/02348; H01L 21/0214; H01L 21/3125; H01L 21/0276; H01L 21/0273; H01L 21/0332; H01L 21/76832; H01L 21/0274; H01L 21/312; H01L 21/027; G03F 7/0757; G03F 7/095; G03F 7/11; G03F 7/0035; G03F 7/00; G03F 7/004; G03F 7/203; G03F 7/16; G03F 7/70466
USPC .................. 430/322, 324, 314, 315
See application file for complete search history.

(56) References Cited

U.S. PATENT DOCUMENTS

| 5,770,260 | A | 6/1998 | Fukuyama et al. |
| 6,107,172 | A | 8/2000 | Yang et al. |
| 6,306,560 | B1 * | 10/2001 | Wang et al. .................... 430/316 |
| 2002/0113241 | A1 | 8/2002 | Kubota et al. |
| 2008/0305611 | A1 | 12/2008 | Hirota |
| 2011/0185948 | A1 * | 8/2011 | Uemura et al. ................ 106/632 |

FOREIGN PATENT DOCUMENTS

| JP | 07-206410 | 8/1995 |
| JP | 10-194873 | 7/1998 |
| JP | 2002-270690 | 9/2002 |
| JP | 2003-118029 | 4/2003 |
| JP | 2006-261616 | 9/2006 |
| JP | 2010-080709 | 4/2010 |
| JP | 2010-080709 A | 4/2010 |
| JP | 2001-176788 | 6/2011 |
| WO | WO-2010/024378 A1 | 3/2010 |
| WO | WO-2010/143283 A1 | 12/2010 |
| WO | WO-2011/007543 A1 | 1/2011 |

OTHER PUBLICATIONS

International Preliminary Report on Patentability for International Application No. PCT/IB2011/001839, dated Jan. 15, 2013 (5 pages).
International Search Report from PCT/IB2011/001839, dated Dec. 13, 2011.
Funayama et al., "Conversion mechanism of perhydropolysilazane into silicon nitride-based ceramics," J Materials Sci. 29(18):4883-8 (1994).
Kuo, "PECVD silicon nitride as a gate dielectric for amorphous silicon thin film transistor," J Electrochem Soc. 142(1):186-90 (1995).
International Search Report for International Patent Application No. PCT/JP2011/064248, mailed Sep. 20, 2011 (4 pages).
International Preliminary Report on Patentability for International Patent Application No. PCT/JP2011/064248, mailed Jan. 9, 2014 (9 pages).
Notification of Reason for Rejection for Japanese Patent Application No. 2010-138102, mailed Feb. 7, 2014 (4 pages).
Extended European Search Report for European Application No. 11795255.6, dated Nov. 7, 2013 (6 pages).

* cited by examiner

Primary Examiner — Caleen Sullivan
(74) Attorney, Agent, or Firm — Clark & Elbing LLP

(57) ABSTRACT

The present invention provides a silicon oxynitride film formation method capable of reducing energy cost, and also provides a substrate equipped with a silicon oxynitride film formed thereby. This method comprises the steps of: casting a film-formable coating composition containing a polysilazane compound on a substrate surface to form a coat; drying the coat to remove excess of the solvent therein; and then irradiating the dried coat with UV light at a temperature lower than 150° C.

7 Claims, No Drawings ical Field

This invention relates to a silicon oxynitride film formation method and also to a silicon oxynitride film formed thereby. Specifically, the present invention relates to a method for efficiently and inexpensively producing a silicon oxynitride film which can be used advantageously as an insulating film or a protective film in a semiconductor device or a liquid crystal display or otherwise as a surface modifying coating for ceramics, metals and the like.

BACKGROUND ART

Films of siliceous ceramics, such as silica, silicon nitride and silicon oxynitride, are excellent in heat resistance, in abrasion resistance and in corrosion resistance, and hence they are used as, for example, insulating films in semiconductor devices and liquid crystal displays and also as protective films provided on pixel electrodes or color filters therein. Among those films, a silicon nitride film is characterized by being stable at a high temperature particularly in an inert or reductive atmosphere and also by being a transparent film with a high refractive index, as compared with a silica film and the like. Accordingly, in view of the compactness and the high refractive index, the silicon nitride film is employed advantageously as a protective film or a gas barrier film in a recent optical device.

In the technical field described above, a silicon nitride film and a silicon oxynitride film (which are hereinafter often referred to as a "SiN film" and a "SiON film", respectively) are generally formed on substrates according to chemical vapor deposition method (hereinafter, referred to as "CVD method") or other vapor deposition method such as sputtering method.

However, a siliceous ceramic film can be also formed according to casting method in which a film-formable coating solution comprising a silicon-containing compound, such as silicon hydroxide or polysilazane, is cast on a substrate and then heated so as to oxidize and convert the silicon-containing compound into silica, silicon nitride or silicon oxynitride. For example, a process is known in which perhydropolysilazane or a denatured substance thereof is cast on a substrate and then fired at 600° C. or more in vacuum to obtain a SiN film (Patent document 1). Further, another process is also known in which a composition containing perhydropolysilazane is cast on a substrate and then converted into amorphous silicon nitride by heating at 650° C. for about 30 minutes in an inert atmosphere (Non-patent document 1).

The casting method is widely adopted because it can be performed in relatively simple facilities. However, since the heating treatment is carried out at a relatively high temperature, the cost of thermal energy is considerable and the productivity of the method is relatively poor.

The vapor deposition method is also generally adopted. However, a film formed according to the CVD method often has a surface of insufficient smoothness. In addition, if the substrate has a surface provided with grooves thereon, it is so difficult to fill the grooves in evenly that voids may be formed in the grooves.

In order to improve those problems of the vapor deposition method, it is studied that CVD procedures are carried out at a temperature of about 350° C. to form an amorphous silicon nitride film (Non-patent document 2). However, the CVD procedures, which are generally complicated, are made further complicated in this process. In addition, this process costs a lot and the productivity thereof is relatively low, and hence there are rooms for improvement.

Further, a SiN film formed according to the CVD method often gives off ammonia gas. Because of that, if the SiN film formed by the CVD method is adopted as a bottom antireflective coating on which a resist pattern is formed, the resultant resist pattern may be in the form of ridges with lower slopes. This form is referred to as "resist footing", which is unfavorable for the resist pattern. It is hence often necessary to form a SiO film as a capping layer on the SiN film formed by the CVD method. However, if the capping layer is provided, the resist pattern may be in the form of ridges having thin bottoms. This form is referred to as "bottom pinch", which is also unfavorable for the resist pattern. Accordingly, if the SiN film formed according to the CVD method is used as a bottom antireflective coating, the resultant resist pattern is liable to suffer from the resist footing or bottom pinch. It has been desired to improve this problem.

As for the SiN film formation method, there is an attempt to lower the temperature of the heating treatment in the casting method (Patent document 2). In this attempt, a solution of perhydro-type polysilazane is cast on a substrate and then subjected to the heating treatment at 200 to 300° C. while irradiated with UV light so as to form a SiN film. However, judging from the FT-IR spectra shown in Examples of the above document, there is probability that the formed films are not SiN films but silicon oxide films. In addition, this process is more complicated than normal casting processes. Further, although carried out at a relatively low temperature, the heating treatment is still necessary in the process. Accordingly, in consideration of reduction of the thermal energy cost, there are rooms for further improvement.

PRIOR ART DOCUMENTS

Patent Documents

[Patent document 1] Japanese Patent Laid-Open No. H10 (1998)-194873
[Patent document 2] Japanese Patent Laid-Open No. H7(1995)-206410

Non-Patent Documents

[Non-Patent document 1] Funayama et al., J. Mat. Sci., 29(18), pp. 4883-4888, 1994
[Non-Patent document 2] Y. Kuo, J. Electrochem. Soc., 142, 186, 1995

DISCLOSURE OF INVENTION

Problem to be Solved by the Invention

As described above, all the conventional processes for forming a SiN film have problems of complicated procedures and high thermal energy cost. Those problems should be improved even when the prior arts are applied to formation of SiON films.

Means for Solving Problem

The present invention resides in a silicon oxynitride film formation method comprising a casting step in which a film-formable coating composition containing a polysilazane compound is cast on a substrate surface to form a coat, a drying step in which the coat is dried to remove excess of the solvent therein, and a UV irradiation step in which the dried coat is irradiated with UV light at a temperature lower than 150° C.

The present invention also resides in a substrate equipped with a silicon oxynitride film formed by the above method.

The present invention still also resides in a resist pattern formation process in which a resist pattern is formed by photolithography,
wherein
the method according to any of claims 1 to 7 is used to form a bottom antireflective coating made of silicon oxynitride on the substrate-side surface of the resist layer.

Effect of the Invention

The present invention enables to form a SiON film only by a single stage of the steps, and hence to obtain the film more readily than the conventional methods. According to the present invention, even if the substrate has a surface provided with grooves thereon, the grooves can be filled in so evenly that voids are scarcely formed. Further, the present invention can reduce the thermal energy cost to improve the production efficiency. In the aspect of properties of the silicon nitride film provided by the present invention, it is possible to control the properties, such as, attenuation coefficient, only by controlling the irradiated energy of UV light, and hence it is possible to easily form a SiON film having desired properties. The SiON film thus formed hardly suffers from resist footing or bottom pinch, and is excellent in that the refractive index and absorption coefficient thereof can be controlled by the production conditions. The film is therefore preferably used as a bottom antireflective coating in a lithographic process.

BEST MODE FOR CARRYING OUT THE INVENTION

Embodiments of the present invention are described below in detail.

The SiON film formation method according to the present invention is used for forming on a substrate surface a SiON film originating from a polysilazane compound. The film formed by the present invention is made of silicon oxynitride (SiON), which consists of silicon, oxygen and nitrogen atoms. In the present invention, the refractive index (n) and absorption coefficient (k) of the film can be controlled by controlling the component ratio between oxygen and nitrogen. The higher the nitrogen content is, the more the compactness of the film is improved and accordingly the more the mechanical strength of the film is improved. Further, the refractive index tends to increase in accordance with increase of the nitrogen content. Accordingly, the film is preferably made of silicon oxynitride having an oxygen content of 10% or less by weight.

The oxygen content in the SiON film depends on the components of the used film-formable coating composition and on the film-forming conditions. Those conditions are described later.

The present invention is employed to form a SiON film on a substrate, which is not particularly restricted and can be made of any material such as metal, inorganic or organic substance. For example, the substrate may be a bare silicon wafer or, if necessary, a silicon wafer coated with a thermal oxide layer. According to necessity, the substrate may have structures such as trench isolation grooves. Further, the substrate may be provided with semiconductor devices and wires on the surface.

In the SiON film formation method of the present invention, the substrate surface is coated with a film-formable coating composition containing a solvent and a polysilazane compound. The polysilazane compound used in the present invention is not particularly restricted, and hence can be freely selected unless it impairs the effect of the invention. Further, it may be either an inorganic or organic compound. Examples of the inorganic polysilazane compound include a perhydropolysilazane compound which has a straight-chain structure comprising a structural unit represented by the following formula (I):

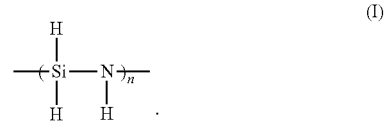

The perhydropolysilazane compound can be produced according to any of the known processes. Basically, it includes a chain structure part and a cyclic structure part in the molecule, and is represented by the following formula:

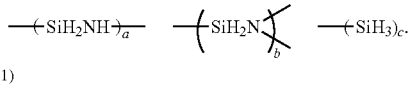

(a + b + c = 1)

Examples of the polysilazane compound also include a polysilazane compound which has a skeleton mainly comprising a structural unit represented by the following formula (II)

(wherein each of $R^1$, $R^2$ and $R^3$ is independently hydrogen, an alkyl group, an alkenyl group, a cycloalkyl group, an aryl group, an alkylsilyl group, an alkylamino group, an alkoxy group, or another group such as a fluoroalkyl group which contains a carbon atom directly connecting to the silicon atom, provided that at least one of $R^1$, $R^2$ and $R^3$ is hydrogen); and modified compounds thereof.

There are no particular restrictions on the molecular weight of the polysilazane compound used in the present invention. However, the polystyrene-reduced average molecular weight of the compound is preferably 1000 to 20000, more preferably 1000 to 10000. Two or more polysilazane compounds can be used in combination.

The film-formable coating composition employed in the present invention contains a solvent capable of dissolving the above polysilazane compound. There are no particular restrictions on the solvent as long as it can dissolve the polysilazane compound to use. Preferred examples of the solvent include:

(a) aromatic compounds, such as, benzene, toluene, xylene, ethylbenzene, diethylbenzene, trimethylbenzene, and triethylbenzene;

(b) saturated hydrocarbon compounds, such as, n-pentane, i-pentane, n-hexane, i-hexane, n-heptane, i-heptane, n-octane, i-octane, n-nonane, i-nonane, n-decane, and i-decane;

(c) alicyclic hydrocarbon compounds, such as, ethylcyclohexane, methylcyclohexane, cyclohexane, cyclohexene, p-menthane, decahydronaphthalene, dipentene, and limonene;

(d) ethers, such as, dipropyl ether, dibutyl ether, diethyl ether, methyl tertiary butyl ether (hereinafter, referred to as MTBE), and anisole; and (e) ketones, such as methyl isobutyl ketone (hereinafter, referred to as MIBK).

Among the above, particularly preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body, and to control the solubility of the components.

It is possible to adopt commercially available solvents. Examples thereof include: Pegasol AN45 ([trademark], manufactured by EXXON Mobil Corporation), which is an aliphatic/alicyclic hydrocarbon mixture containing aromatic hydrocarbons having 8 or more carbon atoms in an amount of 5 to 25 wt % inclusive; and Pegasol D40 ([trademark], manufactured by EXXON Mobil Corporation), which is an aliphatic/alicyclic hydrocarbon mixture not containing aromatic hydrocarbons. If a mixture of solvents is adopted in the present invention, the mixture preferably contains aromatic hydrocarbons in an amount of 30 wt % or less based on the total weight of the mixture so as to reduce the hazardousness to the human body.

The composition used in the present invention can contain other additives, if necessary. Examples of the optional additives include crosslinking accelerators and viscosity modifiers. Further, when used for producing a semiconductor devise, the composition can contain a phosphorus compound such as tris(trimethylsilyl)phosphate for the sake of Na-gettering effect.

The aforementioned polysilazane compound and, if necessary, other additives are dissolved or dispersed in the above organic solvent, to prepare the polysilazane compound-containing composition used in the present invention. In this preparation, there are no particular restrictions on the order of dissolving the components in the solvent. Further, the solvent can be replaced after the components are made to react.

The content of each component depends on the use of the composition. For forming a sufficiently thick SiON film, the content of the polysilazane compound is preferably 0.1 to 40 wt %, more preferably 0.1 to 20 wt %, and further preferably 0.1 to 10 wt %.

The film-formable composition can be cast on the substrate surface according to conventionally known methods, such as spin coating, dip coating, spray coating, transfer coating and the like. Among them, spin coating is particularly preferred. The formed coat is preferably thin enough to harden efficiently when irradiated with UV light in the manner described later. Specifically, the thickness of the coat is preferably 1 μm or less, more preferably 0.2 μm or less. On the other hand, there is no lower limit of the thickness and the thickness is so determined that the formed SiON film can show the desired effects. The coat generally has a thickness of 0.2 μm or less, preferably 0.1 μm or less.

The coat formed on the substrate surface is then dried to remove excess of the solvent. In this step, if the coat is dried at a relatively high temperature, the solvent can be efficiently removed. However, that is not preferred because the application of external thermal energy is liable to increase the thermal energy cost. Accordingly, the coat is dried preferably without applying thermal energy. When the coat is dried nevertheless at a high temperature, the drying temperature is preferably 150° C. or below, more preferably 100° C. or below.

The coat can be dried under a reduced pressure. Specifically, negative pressure can be applied to the substrate coated with the composition by means of a vacuum pump, a rotary pump or the like, so as to accelerate evaporation of the solvent in the coat and thereby to promote the drying.

Successively after dried to remove excess of the solvent, the coat is irradiated with UV light. The conditions of the UV irradiation are properly selected according to the thickness, composition and hardness of the aimed SiON film, but are generally as follows.

The wavelength of the UV light ranges generally from 400 nm to 50 nm, preferably from 300 nm to 100 nm, more preferably from 250 nm to 150 nm. The UV light preferably causes photoelectrons with high energy because the coat hardens rapidly. Specifically, the energy of the photoelectrons is preferably 3 eV or more, more preferably 6 eV or more, particularly preferably 7 eV or more.

The power of UV light source is preferably 1 mW or more, further preferably 5 mW or more, particularly preferably 10 mW or more. The irradiation time is normally 5 minutes or more, preferably 30 minutes or more. The irradiated energy needs to be enough for polysilazane in the coat to convert into silicon oxynitride, and is not particularly restricted except that. The irradiated energy is preferably not lower than 0.5 $kJ/m^2$, more preferably not lower than 1.0 $kJ/m^2$. There are various known UV light sources, and any of them can be used. Examples of them include a xenon discharge lamp, a mercury discharge lamp, an excimer lamp, and a UV LED.

The atmosphere of the UV irradiation is freely selected according to the components and the like of the aimed SiON film. For example, if a film containing nitrogen in a high content is intended to be formed, the UV irradiation is preferably carried out in an atmosphere containing oxygen in a small amount. Specifically, in that case, the UV irradiation is carried out in vacuum or under reduced pressure, or in an inert gas atmosphere. Further, it is also effective that, after the atmosphere is evacuated to reduce the pressure, an inert gas is introduced and then the UV irradiation is carried out therein. Examples of the inert gas include nitrogen, argon, helium and mixed gases thereof. The nitrogen gas used here is inert enough not to be absorbed in the SiON film and accordingly not to increase the nitrogen content of the film. The UV irradiation is not necessarily carried out in an airtight chamber, and may be performed in a flow of inert gas. Further, the irradiation can be carried out in a mixture of inert gas with, for example, ammonia or dinitrogen monoxide. In that case, ammonia or dinitrogen monoxide serves as a nitrogen source to increase the nitrogen content of the SiON film.

For the purpose of reducing the energy cost, it is preferred not to apply external energy in the UV irradiation. However, as long as the total cost does not increase, external energy can be applied to elevate the temperature so that the coat may harden rapidly. Even in that case, the UV irradiation is carried out at a temperature of generally 150° C. or less, preferably 50° C. or less.

The UV irradiation converts the polysilazane compound in the coat into silicon oxynitride to form a SiON film. This conversion can be monitored by means of FT-IR. Specifically, according as the conversion proceeds, the absorption peaks at 3350 $cm^{-1}$ and 1200 $cm^{-1}$, which are attributed to N—H bond, and the peak at 2200 $cm^{-1}$, which is attributed to Si—H bond, become weak and finally disappear. Accordingly, the conversion into a SiON film can be confirmed by observing disappearance of those peaks.

The SiON film thus formed is excellent in stability, in compactness and in transparency, and hence can be used as a protective film, an insulating film or a gas barrier in a semiconductor device or the like. Further, the film can be also used as a top or bottom antireflective coating in a process of producing a semiconductor device. Specifically, in a pattern formation process in which a resist pattern is formed by photolithography, the method of the present invention can be used to form a SiON film as an antireflective coating on the upper- or substrate-side surface of the resist layer in order to prevent reflection or interference in the resist layer. The SiON film according to the present invention is advantageously used as the antireflective coating, in particular, as the bottom antireflective coating formed on the substrate-side surface of the resist layer. For example, in the case where an ArF laser (wavelength: 193 nm) is adopted as a light source of photolithography, the bottom antireflective coating has a refractive index of preferably 1.56 to 2.22, more preferably 1.70 to 2.10, further preferably 1.90 to 2.05 and also an absorption coefficient of preferably 0.20 to 0.80, more preferably 0.30 to 0.70, further preferably 0.40 to 0.60 at that wavelength. On the other hand, in the case where a KrF laser (wavelength: 248 nm) is adopted as a light source of photolithography, the bottom antireflective coating has a refractive index of preferably 1.56 to 2.05, more preferably 1.60 to 1.90, further preferably 1.70 to 1.80 and also an absorption coefficient of preferably 0.20 to 1.90, more preferably 0.30 to 0.70, further preferably 0.40 to 0.60 at that wavelength. The SiON film given by the present invention can sufficiently satisfy those requirements.

down to 76 mBarr. Successively, nitrogen gas was introduced so as to elevate the inner pressure up to the atmospheric pressure, and then the coat was irradiated with UV light in a flow of the nitrogen gas at the rate of 5 L/minute.

The wavelength of the UV light was 172 nm, and the power of the light source was 10 mW. The irradiation time and the irradiated energy were 15 minutes and 1.0 $kJ/m^2$, respectively.

After irradiated with the UV light, the sample was taken out of the chamber and evaluated by means of FT/IR-660 PLUS spectrometer ([trademark], manufactured by JASCO corporation) and VUV302 ellipsometer ([trademark], manufactured by J. A. Woollam Co., Inc.).

As a result of the evaluation by FT-IR, the peaks at 3350 $cm^{-1}$ and 1200 $cm^{-1}$, which were originally small and attributed to N—H bond, were found almost completely disappeared while the peak at 2200 $cm^{-1}$, which was originally relatively large and attributed to Si—H bond, was found weakened to about 1/10. Accordingly, it was conformed that the coat of polysilazane was almost completely converted into a SiON film. The obtained film had a refractive index of 2.052 and an absorption coefficient of 0.3357 at 193 nm, and those values indicated that the film was satisfyingly usable as an antireflective coating.

Examples 2 to 9

The procedure of Example 1 was repeated except for changing the irradiation time of UV light and the atmospheric gas in the UV irradiation, to form films. The results were as set forth in Table 1.

TABLE 1

| | UV irradiation | | Flow gas composition (%) | | | Film composition | | | Film characteristics at 193 nm | | Film characteristics at 248 nm | |
| | Time | Energy | | | | | | | Refractive index | Absorption coefficient | Refractive index | Absorption coefficient |
| Examples | (min.) | (kJ/m²) | N₂ | O₂ | NH₃ | Si | N | O | n | k | n | k |
| 2 | 5 | 0.33 | 100 | — | — | 1.00 | 0.77 | 0.20 | 2.035 | 0.211 | 1.888 | 0.076 |
| 3 | 10 | 0.67 | 100 | — | — | 1.00 | 0.81 | 0.20 | 2.056 | 0.273 | 1.930 | 0.108 |
| 1 | 15 | 1.00 | 100 | — | — | 1.00 | 0.81 | 0.17 | 2.052 | 0.336 | 1.956 | 0.146 |
| 4 | 30 | 2.00 | 100 | — | — | 1.00 | 0.88 | 0.11 | 2.054 | 0.424 | 1.996 | 0.192 |
| 5 | 60 | 4.00 | 100 | — | — | 1.00 | 0.88 | 0.08 | 2.051 | 0.476 | 2.033 | 2.048 |
| 6 | 10 | 0.67 | 97 | — | 3 | 1.00 | 0.86 | 0.30 | 2.016 | 0.211 | 1.880 | 0.099 |
| 7 | 30 | 2.00 | 95 | 5 | — | 1.00 | 0.67 | 0.37 | 1.843 | 0.133 | 1.833 | 0.063 |
| 8 | 30 | 2.00 | 90 | 10 | — | 1.00 | 0.54 | 0.84 | 1.714 | 0.068 | 1.170 | 0.009 |
| 9 | 30 | 2.00 | 80 | 20 | — | 1.00 | 0.22 | 1.31 | 1.644 | 0.002 | 1.613 | 0.001 |

The present invention is further explained below by use of the following examples.

Example 1

A dibutyl ether solution of perhydropolysilazane (weight average molecular weight: 1700) as the polysilazane-containing film-formable composition was cast at 1000 rpm on a silicon wafer. The polymer concentration of the composition was 1 wt %, and the formed coat had a thickness of 0.07 μm.

The coat formed on the substrate was then dried on a hot-plate at 80° C. for 3 minutes.

Thereafter, the substrate was placed in an airtight chamber provided with a quartz window, and the chamber was evacuated with a rotary pump so as to reduce the inner pressure Example 10

Under the conditions of Example 5, a SiON film of 0.07 μm thickness was formed on a silicon wafer. The SiON film was then coated with a far-UV resist AZ TX1311 ([trademark], manufactured by AZ Electronic Materials Ltd.), so that the formed resist layer had a thickness of 0.846 μm after subjected to soft-baking at 140° C. for 180 seconds. Subsequently, the soft-baked resist layer was subjected to exposure at 248 nm by means of FPA-3000EX5 DUV stepper (([trademark], manufactured by Canon Inc.). After the exposure, the wafer was subjected to post-exposure baking at 110° C. for 180 seconds and thereafter subjected to single paddle development with a 2.38 wt % TMAH aqueous solution at 23° C. for 180 seconds. The formed line-and-space pattern was rinsed and dried, and then observed by means of a scanning electron microscope. As a result, the obtained pattern was found to be good enough not to suffer from resist footing or bottom pinch.

Example 11

Under the conditions of Example 4, a SiON film of 0.07 μm thickness was formed on a silicon wafer. The SiON film was then coated with a far-UV resist AZ TX3110P ([trademark], manufactured by AZ Electronic Materials Ltd.), so that the formed resist layer had a thickness of 0.105 μm after subjected to soft-baking at 100° C. for 180 seconds. Subsequently, the soft-baked resist layer was subjected to exposure at 193 nm by means of NSR-S306D scanner (([trademark], manufactured by Canon Inc.). After the exposure, the wafer was subjected to post-exposure baking at 110° C. for 60 seconds and thereafter subjected to single paddle development with a 2.38 wt % TMAH aqueous solution at 23° C. for 30 seconds. The formed line-and-space pattern was rinsed and dried, and then observed by means of a scanning electron microscope. As a result, the obtained pattern was found to be good enough not to suffer from resist footing or bottom pinch.

Comparative Example 1

A SiN film of 0.093 μm thickness was formed on a silicon wafer according to plasma CVD method under the conditions of RF power: 0.3 W/cm² (at 13.56 MHz), total RF power: 300 W/cm², substrate temperature: 330° C., introduced gas: ammonia ($NH_3$)/silane ($SiH_4$)=1/2.5, gas flow: 20 sccm, and vacuum degree: 12 Pa. The formed film was then coated with a far-UV resist AZ TX1311 ([trademark], manufactured by AZ Electronic Materials Ltd.), so that the formed resist layer had a thickness of 0.85 μm after subjected to soft-baking at 140° C. for 180 seconds. Subsequently, the soft-baked resist layer was subjected to exposure at 248 nm by means of FPA-3000EX5 DUV stepper (([trademark], manufactured by Canon Inc.). After the exposure, the wafer was subjected to post-exposure baking at 110° C. for 180 seconds and thereafter subjected to single paddle development with a 2.38 wt % TMAH aqueous solution at 23° C. for 180 seconds. The formed line-and-space pattern was rinsed and dried, and then observed by means of a scanning electron microscope. As a result, the obtained pattern was found to suffer from resist footing.

Comparative Example 2

A SiN film of 0.025 μm thickness was formed on a silicon wafer according to plasma CVD method under the same conditions as in Comparative example 1. The formed film was then coated with a far-UV resist AZ TX3110P ([trademark], manufactured by AZ Electronic Materials Ltd.), so that the formed resist layer had a thickness of 0.1 μm after subjected to soft-baking at 100° C. for 180 seconds. Subsequently, the soft-baked resist layer was subjected to exposure at 193 nm by means of NSR-S306D scanner (([trademark], manufactured by Canon Inc.). After the exposure, the wafer was subjected to post-exposure baking at 110° C. for 60 seconds and thereafter subjected to single paddle development with a 2.38 wt % TMAH aqueous solution at 23° C. for 30 seconds. The formed line-and-space pattern was rinsed and dried, and then observed by means of a scanning electron microscope. As a result, the obtained pattern was found to suffer from resist footing.

Comparative Example 3

A perhydropolysilazane film of 0.07 μm thickness was formed on a silicon wafer in the same manner as in Example 1. The formed film was then coated with a far-UV resist AZ TX1311 ([trademark], manufactured by AZ Electronic Materials Ltd.), so that the formed resist layer had a thickness of 0.846 μm after subjected to soft-baking at 140° C. for 180 seconds. Subsequently, the soft-baked resist layer was subjected to exposure at 248 nm by means of FPA-3000EX5 DUV stepper (([trademark], manufactured by Canon Inc.). After the exposure, the wafer was subjected to post-exposure baking at 110° C. for 180 seconds and thereafter subjected to single paddle development with a 2.38 wt % TMAH aqueous solution at 23° C. for 180 seconds. The formed line-and-space pattern was rinsed and dried, and then observed by means of a scanning electron microscope. As a result, the obtained pattern was found to suffer from such large resist footing that the resist remained also in the space area.

The invention claimed is:

1. A silicon oxynitride film formation method comprising a casting step in which a film-formable coating composition containing a polysilazane compound is cast on a substrate surface to form a coat,
a drying step in which the coat is dried to remove excess of the solvent therein, and
a UV irradiation step in which the dried coat is irradiated with UV light at a temperature lower than 150° C. in an inert atmosphere, wherein the irradiated energy of the UV light is 0.5 kJ/m² or more and the irradiation time is 30 minutes or more.

2. The method according to claim 1, wherein the UV irradiation step is carried out at room temperature.

3. The method according to claim 1, wherein the UV irradiation step is carried out without applying any external energy other than the UV light.

4. The method according to claim 1, wherein the UV light is far UV light in the wavelength range of less than 200 nm.

5. The method according to claim 1, wherein the coat has a thickness of 0.01 to 1.0 μm.

6. A substrate equipped with a silicon oxynitride film formed by the method according to claim 1.

7. A resist pattern formation process in which a resist pattern is formed by photolithography,
wherein
the method according to claim 1 is used to form a bottom antireflective coating made of silicon oxynitride on the substrate-side surface of the resist layer.

* * * * *